United States Patent [19]

Baier et al.

[11] Patent Number: 5,375,255
[45] Date of Patent: Dec. 20, 1994

[54] RADIO RECEIVER COMPRISING ANALOG DYNAMIC COMPRESSION AND DIGITAL EXPANSION

[75] Inventors: Alfred Baier, Eckental; Gerd Heinrich, Erlangen, both of Germany

[73] Assignee: U.S. Philips Corporation, New York, N.Y.

[21] Appl. No.: 939,254

[22] Filed: Sep. 2, 1992

[30] Foreign Application Priority Data

Sep. 6, 1991 [DE] Germany ............................ 4129681

[51] Int. Cl.$^5$ .............................................. H04B 1/16
[52] U.S. Cl. ...................................... 455/72; 455/211; 455/308; 333/14; 375/102
[58] Field of Search ................. 455/72, 210, 211, 308, 455/309, 311, 312, 341, 235.1, 249.1; 333/14; 381/106; 375/80, 83, 88, 98, 102

[56] References Cited

U.S. PATENT DOCUMENTS

| | | | |
|---|---|---|---|
| 4,282,578 | 8/1981 | Payne et al. | 364/573 |
| 4,553,105 | 11/1985 | Sasaki | 455/249.1 |
| 4,631,489 | 12/1986 | Laird et al. | 375/80 |
| 4,726,042 | 2/1988 | Vance | 375/102 |

FOREIGN PATENT DOCUMENTS 3925305  2/1991  Germany ............................ 333/14

Primary Examiner—Reinhard J. Eisenzopf
Assistant Examiner—Chi Pham
Attorney, Agent, or Firm—Leroy Eason

[57] ABSTRACT

A radio receiver for an RF signal which is phase or frequency modulated by an information signal. The receiver has an analog receiving section which provides non-linear dynamic compression. The resulting analog signal is sampled and the samples are digitized by an A/D converter. The non-linear dynamic compression reduces the necessary number of quantizing steps in the A/D converter, which is less expensive, but thereby introduces non-linear distortion. To compensate such distortion, in the digital processing section of the receiver an expansion section is provided which processes the digital signal samples in accordance with the inverse of the non-linear dynamic compression characteristic. The resulting expanded digital sample values equalize the analog non-linear dynamic compression. The information signal is recovered from the expanded digital signals.

6 Claims, 2 Drawing Sheets

RADIO RECEIVER COMPRISING ANALOG DYNAMIC COMPRESSION AND DIGITAL EXPANSION

BACKGROUND OF THE INVENTION

1. Field of the Invention

The invention relates to a radio receiver for a phase or frequency modulated information signal, comprising an analog receiving section which provides non-linear dynamic compression, an analog-to-digital converter and a digital signal processing section.

Radio receivers of this type can be used, for example, in the Pan-European mobile radio system GSM. In this mobile radio system speech signals in digitized form are transmitted together with other digital signals in a Time-Division Multiple Access mode (TDMA).

2. Description of the Related Art

DE 39 25 305 A1 has disclosed a radio receiver of the type mentioned in the opening paragraph. In that document the frequency of a received information signal is selected in an analog receiving section of the radio receiver and converted into an intermediate frequency by means of a mixer. An IF amplifier which performs non-linear dynamic compression is connected to the IF mixer. As a result, the output signal of the IF amplifier is either compressed or limited, depending on the input signal level. The output signal of the IF amplifier is applied to a baseband converter which produces therefrom two quadrature components. These quadrature components are sampled and applied to an analog-to-digital converter. Subsequently, the sampled digital values are buffered in a digital signal processing section, a channel estimate is made and an equalization and a decoding is performed. The non-linear dynamic compression and limitation achieves that a more cost-effective analog-to-digital converter can be used, having a relatively small number of quantization steps. Even at the largest possible levels of the input information signal there is no overload of the analog-to-digital converter, and, nevertheless, even at the smallest possible input levels usable sample values are still produced. However, in practice is found that the output signal of the digital signal processing section has bit errors.

SUMMARY OF THE INVENTION

It is an object of the invention to improve a radio receiver of the type mentioned in the opening paragraph so that the bit error rate of the output signal of the digital signal processing section is small.

This object is achieved in a radio receiver of the aforesaid type, in that the digital signal processing section comprises an expansion section to compensate for the non-linear dynamic compression of the analog receiving section.

The invention is based on the recognition that on account of the dynamic compression the radio receiver is capable of processing information signals which have a large dynamic range, but that the dynamic compression also causes non-linear distortions to occur, as a result of which bit errors may be produced in the output signal of the digital signal processing section. These non-linear distortions may be compensated by including an expansion section in the digital signal processing section, so that bit errors due to the non-linear distortions are compensated in the output signal of the digital signal processing section.

The analog receiving section comprises, for example, an input circuit which selects the frequency of the received information signal, and which includes one or more intermediate frequency mixers for converting the information signal to one or more intermediate frequencies. The analog receiving section further includes an arrangement for non-linear dynamic compression. The input signal to the dynamic compression arrangement is thereby either compressed or limited, depending on the signal level. Such a compression characteristic for dynamic compression is represented and described in, for example, DE 39 25 305 A1. The compression characteristic therein has a logarithmic behaviour in a first region, and a limiting behavior in a succeeding second region. Then there follows a quadrature conversion to baseband, two quadrature components being produced. These components are then subjected to analog-to-digital conversion, and the thus obtained digitized quadrature components are processed in the digital signal processing section. In order to compensate for the non-linear distortions caused by the dynamic compression, in accordance with the invention the analog-to-digital conversion is followed by an expansion section which performs an expansion of the two digitized quadrature components. The thus produced expanded quadrature components are subsequently processed in known fashion by the digital signal processing section, which, for example, includes a channel estimator and an equalizer. Consequently, it is possible to use a cost-effective analog-to-digital converter to process information signals which have a large dynamic range, and without causing disturbing non-linear distortions. As a result of the expansion, the distortions caused by the dynamic compression are cancelled and thus also bit errors due to such distortions are prevented from occurring in the output signal of the digital signal processing section, which bit errors would have resulted in the absence of an expansion.

In an advantageous embodiment, pairs of inverse function values which are inversely proportional to the characteristic of the non-dynamic compression are determined in the expansion section for each pair of sample values of digitized quadrature components of the information signal, and are used for linear equalization of the digitized quadrature components. The non-linear characteristic of the analog dynamic compression is described, from example, by a mathematic function for which also the inverse function may be determined. In the expansion section the pairs of inverse function values may thus, for example, be calculated on the basis of the pairs of sample values of the digital quadrature components. With the aid of these pairs of inverse function values a linear equalization of the pairs of sample values of the digitized quadrature components may be effected in the expansion section, so that the non-linear distortions of the dynamic be effected in the expansion section, so that the non-linear distortions of the dynamic compression are cancelled.

In an advantageous embodiment the expansion section comprises a Table in which a pair of inverse function values is stored for each pair of possible sample values of the digitized quadrature components resulting from the non-linear dynamic compression. This is advantageous in that for each pair of sample values the inverse function need not be calculated each time, because the pair of inverse function values for each pair of sample values of the digitized quadrature components is already stored in the Table of the expansion section.

However, this requires a relatively large storage capacity for the Table.

In another embodiment, therefore, the expansion section comprises a Table in which an expansion factor is stored for each pair of sample values of the digitized quadrature components. Since the non-linear dynamic compression affects the value of the information signal, for each pair of sample values only one expansion factor need be stored in the Table instead of a pair of inverse function values. The values of the expanded quadrature components at the output of the expansion section are then derived as the product of the relevant expansion factor and each digitized quadrature component. Consequently, the memory capacity of the Table may be considerably reduced.

In a further embodiment the memory cells of the Table are addressed by a pair of sample values of the digitized quadrature components. The pair of sample values of the digitized quadrature components are thus simultaneously used for addressing each memory cell of the Table, in which either the pairs of inverse function values themselves or the corresponding expansion factors are stored.

In a further advantageous embodiment the memory cells of the Table are addressed by only a predetermined number of most significant bits of a pair of sample values of the digitized quadrature components. The address of a specific memory cell thus does not require the full word size of the pair of sample values of the digitized quadrature components, but only the most significant bits of each digitized quadrature component value. As a result, the size of the Table is considerably reduced without resulting in appreciable distortions of the information signal occurring.

BRIEF DESCRIPTION OF THE DRAWINGS

The invention will be further explained in the following with reference to the embodiments shown in the drawing Figures, in which.

DESCRIPTION OF THE PREFERRED EMBODIMENTS

Figure 1:
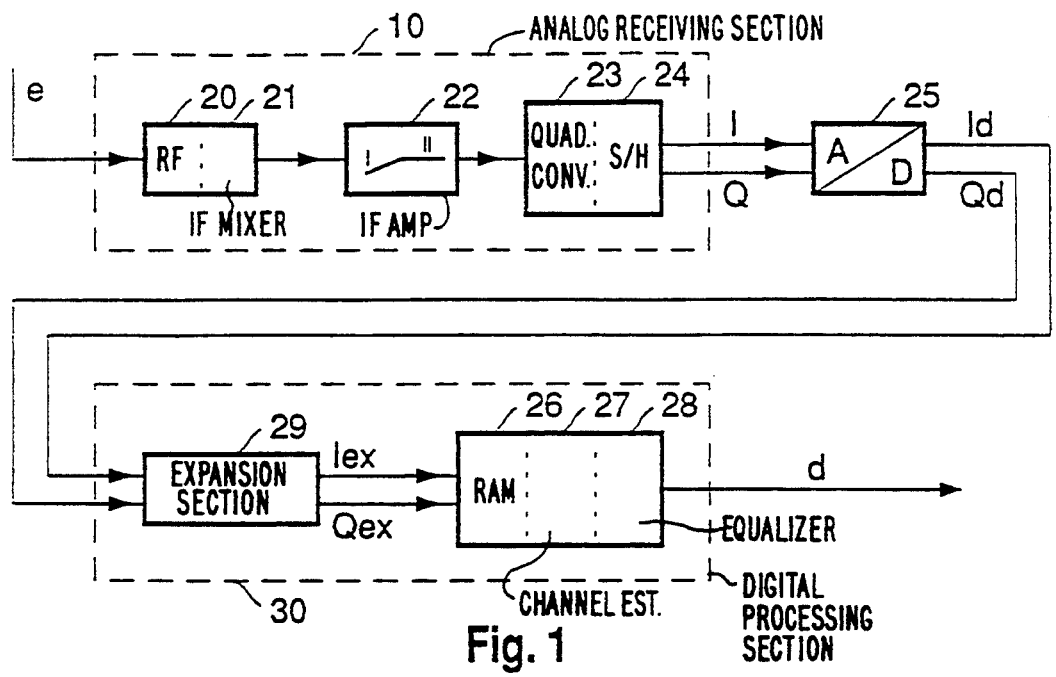
FIG. 1 is a block diagram of a radio receiver.

The radio receiver represented in FIG. 1 comprises an analog receiving section 10, an analog-to-digital converter 25 and a digital signal processing section 30. A received phase or frequency modulated RF signal, modulated by an e, is applied to the analog receiving section 10. The analog receiving section 10 comprises an RF input section 20 for frequency selection, an IF mixer 21, an IF amplifier 22 having non-linear dynamic compression, quadrature baseband converter 23, and a sample-and-hold circuit 24. Quadrature signal components I and Q produced at the output of the sample-and-hold circuit 24 are applied to the analog-to-digital converter 25, at whose outputs digitized quadrature components Id, Qd are available. The digitized quadrature components Id and Qd are applied to the digital signal processing section 30, which comprises an expansion section 29, a random-access memory 26, a channel estimator 27 as well as an equalizer 28. At the output of the expansion section 29 expanded quadrature components Iex and Qex are available, whereas the output of the equalizer 28 presents a decoded information signal.

In the RF input circuit 20 the received signal is first frequency selected and then converted to an intermediate frequency by means of the IF mixer 21. The signal thus converted is subsequently subjected to a non-linear dynamic compression in the IF amplifier 22. The of such a dynamic compression characteristic is denoted in the block representing the IF amplifier 22. Such amplifier has in a first region I of its power transmission characteristic a dynamic compression, and in a subsequent region II a limitation, of the input signal. Such a dynamic compression characteristic has been shown and described in DE 39 25 305 A1 already mentioned above, and also in FIG. 4. hereof. As a result non-linear dynamic compression of the it is possible to utilize a cost-effective analog-to-digital converter while, nevertheless, processing signals which have a large dynamic range, but at the cost introducing non-linear distortions. In the analog receiving section 10, subsequent to the dynamic compression the information signal is subdivided by baseband converter 23 into two quadrature components I and Q, which are then sampled in the sample-and-hold circuit 24 and applied to the analog-to-digital converter 25.

For equalizing the distortions caused by the dynamic compression in amplifier 22, the digitized quadrature components Id and Qd are expanded in the expansion section 29. A first possibility is that in the expansion section pairs of inverse functions can be determined for each pair of sample values of the digitized quadrature components Id, Qd which will linearly equalize the digitized quadrature components Id, Qd. The pairs of inverse function values can be calculated from the inverse of the non-linear characteristic of the IF amplifier 22, as described by a mathematical function. The expansion is then effected in accordance with the calculated pairs of inverse function values. Since the dynamic compression of the amplifier 22 affects the values of the quadrature components I, Q, the inverse of the dynamic compression characteristic and thus also the pairs of inverse function values depend on the values of the quadrature components I and Q.

A recalculation of each the inverse function values for each pair of sample values Id, Qd of the quadrature components would require much calculation circuitry and consequent high cost. For this reason, in a second option, the inverse function is not calculated again for each pair of sample values, but instead the expanded quadrature component values Iex, Qex for each possible pair of sample values of a digitized quadrature components Id, Qd are stored in the Table in the expansion section 29. The memory cells of the Table are then addressable by the pair of sample values of the digitized quadrature components Id, Qd. The disadvantage of this solution is the need for an enormous memory capacity. For example, for an 8-bit word size of the analog-to-digital converter 25 and a 16-bit word size of the expanded values Iex, Qex, the Table has a size of:

$$2^8 * 2^8 * 2 * 16 \text{ bits} = 2\ 097\ 152 \text{ bits}.$$

This need for memory capacity may be reduced if instead of storing the actual for the expanded values expanded signal values for the expanded values of quadrature components Iex, the Table stores Qex, only an expansion factor F(Id, Qd) which depends on the values of the quadrature components Id and Qd. The expanded quadrature component values Iex, Qex are then calculated according to the following instruction:

$$Iex = F(Id, Qd) * Id$$

$$Qex = F(Id, Qd) * Qd.$$

Consequently, for example, for an 8-bit word size the analog-to-digital converter 25 and an 8-bit word size of the expansion factor, the size of the Table is:

$$2^8 * 2^8 * 8 \text{ bits} = 524\ 288 \text{ bits}.$$

A further reduction of the Table size may be achieved in that the address of a memory cell of the Table is not based on the full word size of the digitized quadrature components but only the most significant bits of a pair of sample values of the digitized quadrature component values Id, Qd are used for the addressing. The calculation of the expanded signal values is then represented as follows:

$$Iex = F(Im, Qm) * Id$$

$$Qex = F(Im, Qm) * Qd.$$

In this representation Im and Qm represent the most significant bits of a pair of sample values of the quadrature components Ia and Qa. A detailed representation of such a form of instruction is described and represented in FIG. 3. For an 8-bit word size of the analog-to-digital converter 25, and with calculation of the expansion factor on the basis of only the 5 most significant bits (m=5), the size of the Table will then only:

$$2^5 * 2^5 * 8 \text{ bits} = 8192 \text{ bits}.$$

This will leave very small residual distortions of the information signal which, however, do not have a disturbing effect on the further digital signal processing. The further digital signal processing of the thus expanded quadrature component values Iex, Qex is effected in known fashion by means of buffering in the random-access memory 26 and subsequent channel estimation 27 and equalization 28 as described, for example, in DE 39 25 305 A1.

Figure 2:
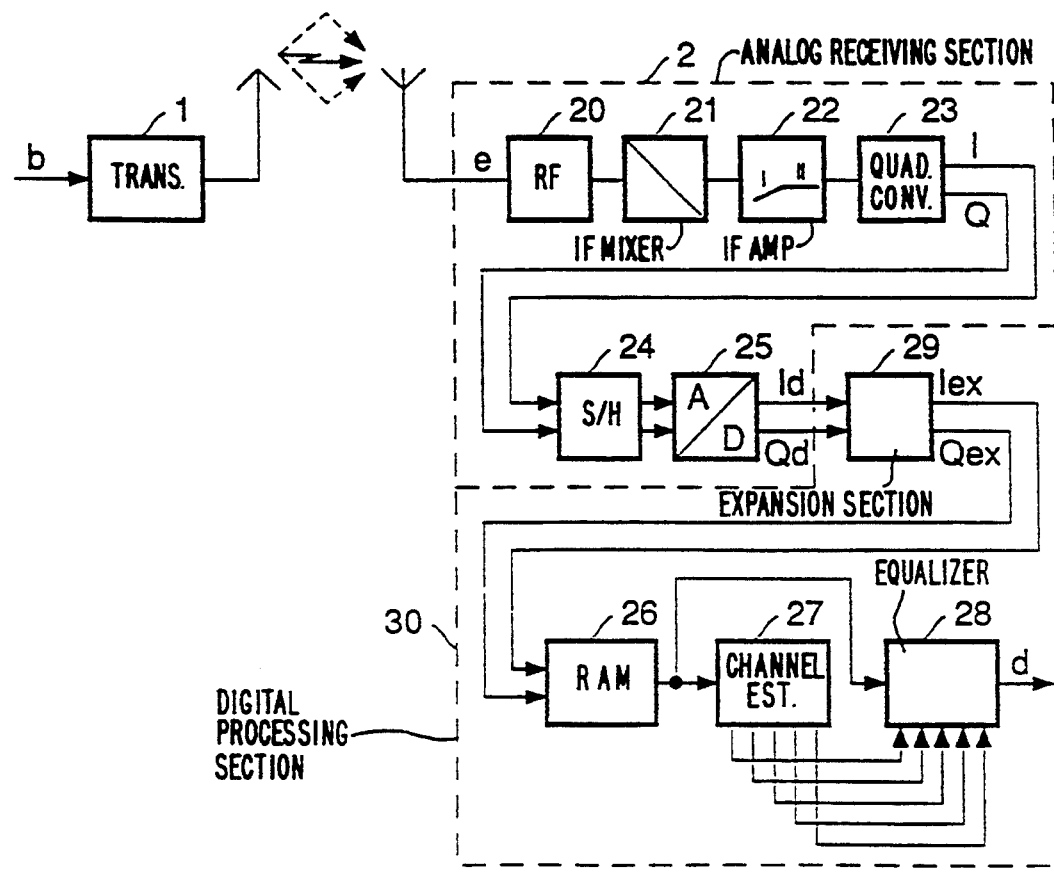
FIG. 2 is a block diagram of a digital information transmission system comprising a radio receiver as in FIG. 1.

FIG. 2 shows a digital radio transmission system in which information in the form of a binary signal b is transmitted by modulating an RF carrier via a transmitter 1. Between the transmitter 1 and the receiver 2 there is a radio transmission path denoted by an arrow. The transmitted modulated signal is received by a radio receiver 2. The radio receiver 2 comprises an analog receiving section as in FIG. 1 having an analog-to-digital converter 25 and a digital signal processing section 30.

The functions of the individual components of the such digital transmission system have, in essence, already been described in connection with FIG. 1 and are also contained in DE 39 25 305 A1. In contradistinction to the digital transmission system described in therein, however, the digital signal processing section 30 here comprises an expansion section 29. This effects a compensation for the non-linear dynamic compression 22 performed by the analog receiving section, as has already been described in connection with FIG. 1.

Figure 3A:
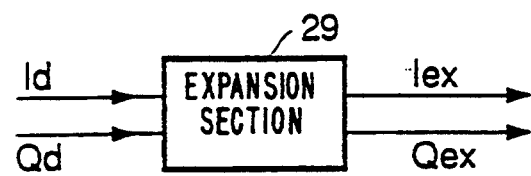
FIGS. 3a, 3b each show an embodiment of the expansion section of said radio receiver.
Figure 3B:
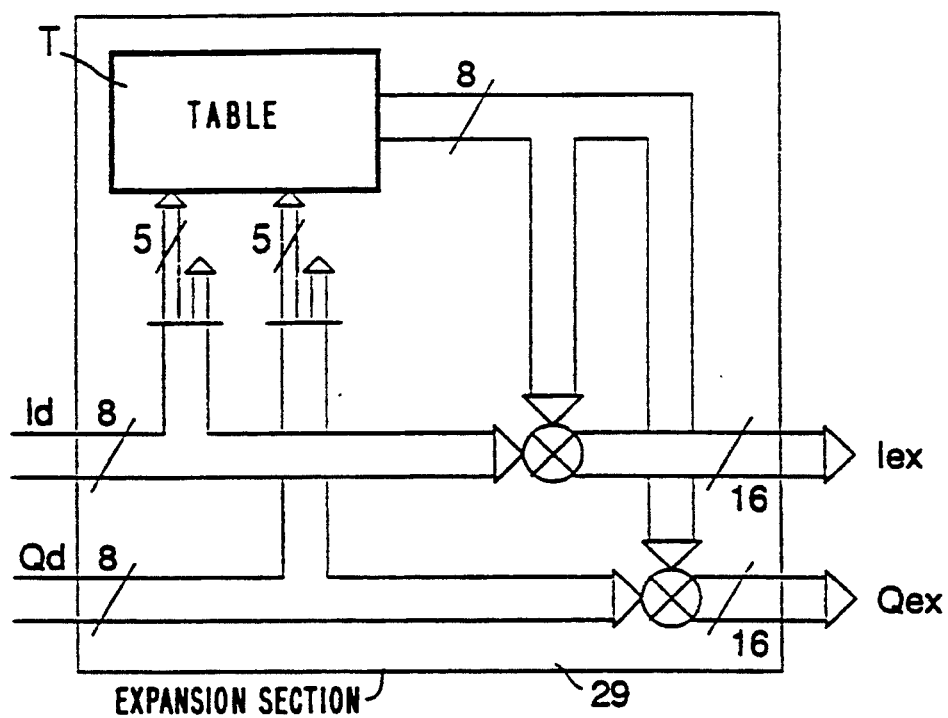

FIGS. 3a, 3b each show the expansion section 29 used in the digital signal processing section 30 of a radio receiver as in FIGS. 1 and 2. The expansion section 29 derives expanded quadrature component values Iex, Qex for a pair of sample values of the digitized quadrature components Id, Qd. For this purpose, FIG. 3a shows that the digitized quadrature component values Id, Qd are applied to the expansion section 29 which, in essence, is constituted by a Table. At the output of the expansion section 29 the expanded quadrature component values Iex, Qex are available. As already described in connection with FIG. 1, the Table of the expansion section 29 stores for each pair of sample values of the digitized quadrature components Id, Qd a pair of inverse function values, i.e., the expanded quadrature component values Iex, Qex, or alternatively an expansion factor. For addressing the individual memory cells of the Table T, each time a pair of values Id, Qd is used.

FIG. 3b shows an embodiment of the expansion section 29 wherein the digitized quadrature component values Id, Qd each have an 8-bit word size; i.e., in the radio receiver an analog-to-digital converter with an 8-bit word size is used. This is symbolized in FIG. 3b by means of /8 at the individual signal arrows. To reduce the Table size, only the most significant bits, for example, the 5 most significant bits, are used for addressing the Table T to obtain the expanded quadrature components Iex, Qex from the 8 bits of each of the digitized quadrature components Id, Qd, of a signal sample the remaining least significant bits being discarded. This is illustrated in FIG. 3b by means of the signal arrows denoted by /5. For each pair of individual digitized quadrature components Id, Qd an expansion factor is stored in a memory cell in the Table, which factor can be selected by using the digitized quadrature components Id, Qd as memory cell addresses. The expansion factor may only have positive values. The expansion factor is used as a multiplier for the digitized quadrature components Id, Qd, thus producing the expanded quadrature components Iex, Qex. The maximum word size of the expansion factor may be selected at random and determines the total word size of the expanded quadrature components Iex, Qex. In this manner, with an analog-to-digital converter having an 8-bit word size and with a maximum expansion factor of 255 there is a final word size of the expanded quadrature components Iex, Qex of 16 bits each. As a result, in the embodiment shown in FIG. 3b the Table T has a size of:

$$2^5 * 2^5 * 8 \text{ bits} = 8192 \text{ bits}.$$

Figure 4:
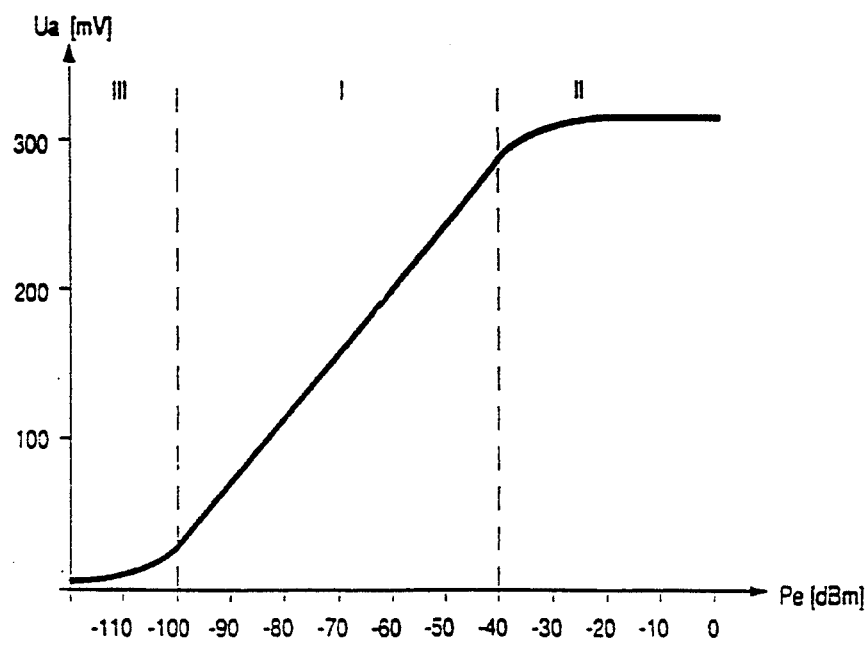
FIG. 4 shows the compression characteristic of a non-linear dynamic compression.

FIG. 4 gives shows a compression characteristic which has a logarithmic behaviour in a specific region for non-linear dynamic compression, as has already been explained with respect to the IF amplifier 22 described in FIGS. 1 and 2 and also in DE 39 25 305 A1. The characteristic shows the output signal Ua of the IF amplifier 22 shown in the FIGS. 1 and 2, in mV, plotted against the input signal level denoted Pe, in dBm. The characteristic has a linear region III, a logarithmic region I and a limitation region II. On the basis of the selected semi-logarithmic representation, the region II is correctly shown. The characteristic shown in FIG. 4 is used for calculating the inverse function values or expansion values respectively, which are stored in the Table shown in the FIG. 3b. For this purpose, first an equation of the characteristic has to be determined. This corresponds to calculation of the compression values of the IF amplifier 22 (FIGS. 1, 2). Subsequently, the inverse function is then calculated, which is digitally approximated and quantized, as required.

We claim:

1. A radio receiver for receiving a radio frequency (RF) signal which is phase or frequency modulated by an information signal, said receiver comprising:

an analog receiving section which includes
   means for converting the RF signal to an intermediate frequency (IF) signal,
   means for subjecting the IF signal to signal level compression in accordance with a non-linear dynamic compression characteristic, and
   means for sampling the compressed IF signal to derive sample values thereof;

an A/D converter for receiving and converting the compressed IF signal sample values into corresponding compressed digital sample values; and a digital processing section which includes
   an expansion section for receiving and digitally processing the compressed digital sample values in accordance with function values which correspond to the inverse of said dynamic compression characteristic, thereby deriving expanded digital sample values which equalize said compression characteristic; said function values being stored in a Table having storage locations corresponding to possible compressed digital sample values; and
   means for digitally processing the expanded digital sample values to recover said information signal therefrom.

2. A radio receiver as claimed in claim 1, wherein:
said means for sampling the compressed IF signal comprises means for deriving quadrature components thereof and means for sampling the quadrature components;
said A/D converter is adapted to convert the sampled quadrature components into corresponding quadrature digital sample values (Id, Qd); and
the function values in storage locations of said Table respectively relate to respective pairs of quadrature digital sample values, and said expansion means is adapted to derive from said function values expanded digital sample values corresponding to each pair of quadrature digital sample values.

3. A radio receiver as claimed in claim 2, wherein the function values in storage locations in said Table are in the form of expanded digital sample values ($I_{ex}$, $Q_{ex}$) corresponding to pairs of quadrature digital sample values (Id, Qd).

4. A radio receiver as claimed in claim 2, wherein the function values in storage locations in said Table are in the form of expansion factors relating to respective pairs of quadrature digital sample values (Id, Qd), and said expansion means is adapted to multiply a pair of quadrature digital sample values by the relevant expansion factor in said Table in order to derive a corresponding pair of expanded digital sample values.

5. A radio receiver as claimed in claim 4, wherein each of the storage locations in said Table has an address corresponding to a pair of quadrature digital sample values (Id, Qd).

6. A radio receiver as claimed in claim 5, wherein each address corresponds to a predetermined number of most significant bits of each of a pair of quadrature digital sample values (Id, Qd).

* * * * *